United States Patent
Arai et al.

(10) Patent No.: US 7,517,760 B2
(45) Date of Patent: Apr. 14, 2009

(54) SEMICONDUCTOR DEVICE MANUFACTURING METHOD INCLUDING THREE GATE INSULATING FILMS

(75) Inventors: Hideyuki Arai, Toyama (JP); Takashi Nakabayashi, Toyama (JP); Yasutoshi Okuno, Kyoto (JP)

(73) Assignee: Panasonic Corporation, Osaka (JP)

( * ) Notice: Subject to any disclaimer, the term of this patent is extended or adjusted under 35 U.S.C. 154(b) by 44 days.

(21) Appl. No.: 11/702,593

(22) Filed: Feb. 6, 2007

(65) Prior Publication Data

US 2007/0275529 A1 Nov. 29, 2007

(30) Foreign Application Priority Data

Mar. 31, 2006 (JP) ............................. 2006-098247

(51) Int. Cl.
*H01L 21/8234* (2006.01)
*H01L 21/8236* (2006.01)
*H01L 21/336* (2006.01)

(52) U.S. Cl. .................. 438/275; 438/276; 438/289; 438/296; 257/E21.409

(58) Field of Classification Search .......... 438/275, 438/276, 289, 296; 257/E21.409
See application file for complete search history.

(56) References Cited

U.S. PATENT DOCUMENTS

| | | | |
|---|---|---|---|
| 6,376,316 B2* | 4/2002 | Shukuri et al. .............. 438/275 |
| 6,465,323 B1 | 10/2002 | Yu et al. | |
| 6,890,822 B2* | 5/2005 | Kim et al. ................... 438/275 |
| 2001/0016388 A1* | 8/2001 | Koyama et al. ............. 438/275 |
| 2002/0105041 A1* | 8/2002 | Goto et al. .................. 257/410 |
| 2002/0137287 A1* | 9/2002 | Takebuchi ................... 438/258 |
| 2003/0027391 A1* | 2/2003 | Yu et al. ..................... 438/275 |
| 2004/0023459 A1* | 2/2004 | Masuoka .................... 438/275 |
| 2004/0198001 A1* | 10/2004 | Chen et al. .................. 438/275 |
| 2006/0003511 A1* | 1/2006 | Hebert et al. ............... 438/199 |
| 2006/0223266 A1* | 10/2006 | Lim et al. ................... 438/275 |
| 2006/0252209 A1* | 11/2006 | Mori .......................... 438/264 |
| 2007/0004146 A1* | 1/2007 | Prinz et al. .................. 438/261 |
| 2007/0122981 A1* | 5/2007 | Park .......................... 438/275 |
| 2007/0218636 A1* | 9/2007 | Niimi et al. ................. 438/275 |
| 2008/0057645 A1* | 3/2008 | Lin et al. .................... 438/257 |

FOREIGN PATENT DOCUMENTS

| | | |
|---|---|---|
| JP | 2002-343879 | 11/2002 |
| JP | 2003-203988 | 7/2003 |

\* cited by examiner

*Primary Examiner*—Hsien-ming Lee
*Assistant Examiner*—Kevin A Parendo
(74) *Attorney, Agent, or Firm*—McDermott Will & Emery LLP

(57) ABSTRACT

After protective insulating films are formed on first to third active regions, the protective insulating films formed on the first and third active regions are removed. Subsequently, an insulating film to be a first gate insulating film is formed on each of the first and third active regions, and then, the protective insulating film formed on the second active region is removed. Next, an insulating film to be a second gate insulating film is formed on the second active region, and then, the insulating film to be the first gate insulating film formed on the third active region is removed. Finally, an insulating film to be a third gate insulating film is formed on the third active region.

12 Claims, 13 Drawing Sheets

FIG. 5

|  | Conventional Example | | | | Embodiment 1 | | |
| --- | --- | --- | --- | --- | --- | --- | --- |
|  | High speed MOSFET | Low leakage MOSFET | Input/output MOSFET | | High speed MOSFET | Low leakage MOSFET | Input/output MOSFET |
| Protective oxidation | 11 | 11 | 11 | | 11 | 11 | 11 |
| First wet etching | Removed | Removed | Removed | | Removed | | Removed |
| First gate oxidation | 6.5 | 6.5 | 6.5 | | 6.5 | 0.8 | 6.5 |
| Second wet etching | | Removed | | | | Removed | |
| Second gate oxidation | 1 | 5.5 | 1 | | 1 | 5.5 | 1 |
| Third wet etching | Removed | | | | Removed | | |
| Third gate oxidation | 2.2 | 0 | 0 | | 2.2 | 0 | 0 |
| Total oxide amount | 20.7 | 23 | 18.5 | | 20.7 | 17.3 | 18.5 |

FIG. 10

| | Embodiment 1 | | | Embodiment 4 | | |
|---|---|---|---|---|---|---|
| | High speed MOSFET | Low leakage MOSFET | Input/output MOSFET | High speed MOSFET | Low leakage MOSFET | Input/output MOSFET |
| Protective oxidation | 11 | 11 | 11 | 11 | 11 | 11 |
| First wet etching | Removed | | Removed | | | Removed |
| First gate oxidation | 6.5 | 0.8 | 6.5 | 0.8 | 0.8 | 6.5 |
| Second wet etching | | Removed | | Removed | Removed | |
| Second gate oxidation | 1 | 5.5 | 1 | 5.5 | 5.5 | 1 |
| Third wet etching | Removed | | | Removed | | |
| Third gate oxidation | 2.2 | 0 | 0 | 2.2 | 0 | 0 |
| Total oxide amount | 20.7 | 17.3 | 18.5 | 19.5 | 17.3 | 18.5 |

SEMICONDUCTOR DEVICE MANUFACTURING METHOD INCLUDING THREE GATE INSULATING FILMS

FIELD OF THE INVENTION

The present invention relates to a method for manufacturing a MOS semiconductor device including three kinds of gate insulating films of which thicknesses are different from one another.

BACKGROUND ART

Conventionally, in MOS (metal-oxide semiconductor) semiconductor device manufacturing methods, there has been employed a process of forming two kinds of gate insulating films having different thicknesses in a single chip. For example, in semiconductor devices in 65 nm design rule generation, a high speed MOSFET (FET: field-effect transistor) including a thin gate insulating film having a thickness of approximately 2.2 nm is provided in an internal circuit operated at 1.2 V while an input/output MOSFET including a thick gate insulating film having a thickness of approximately 7.5 nm is provided in an input/output circuit operated at 3.3 V.

Currently, there are being examined a semiconductor device in which a low leakage MOSFET that lays weight on a function as a memory cell transistor of a DRAM (dynamic random-access memory) is formed together with the high speed MOSFET and the input/output MOSFET in a single chip. Wherein, the gate insulating film of the low leakage MOSFET has a thickness larger than the gate insulating film of the high speed MOSFET and smaller than the gate insulating film of the input/output MOSFET. Accordingly, a method for manufacturing a semiconductor device having three kinds of gate insulating films having different thicknesses in a single chip is demanded. For forming the three kinds of gate insulating films on a single substrate, a semiconductor device manufacturing method in which thermal oxidation is performed three times has been proposed (see Patent Document 1).

FIG. 11A to FIG. 11D, FIG. 12A to FIG. 12C, and FIG. 13A to FIG. 13C are sectional views showing respective steps of a conventional semiconductor device manufacturing method, specifically, a method of manufacturing a conventional MOS semiconductor device including three kinds of gate insulating films.

As shown in FIG. 11A, after forming in a silicon substrate 20 trench isolation regions 19 for separating an input/output MOSFET active region, a low leakage MSFET active region, and a high speed MOSFET active region, the silicon substrate 20 including the active regions is subjected to thermal treatment (protective oxidation) in an oxidation atmosphere. This thermal treatment forms, as shown in FIG. 11B, protective oxide films 21 each having a thickness of approximately 10 nm are formed on the input/output MOSFET active region, the low leakage MOSFET active region, and the high speed MOSFET active region. Then, the respective active regions are subjected to ion implantation for well formation, the low leakage MOSFET active region is subjected to ion implantation for channel formation with the use of a resist pattern 50 that covers the input/output MOSFEET active region and the high speed MOSFET active region as a mask, as shown in FIG. 11C, and then, the resist pattern 50 is removed. FIG. 11C shows a state in which a region 51 to be a channel (hereinafter referred to as a channel region) is formed in the low leakage MOSFET active region. Similarly, ion implantation for channel formation is performed on the input/output MOSFET and on the high speed MOSFET active region with the use of respective resist patterns (not shown) that cover respective predetermined regions, and the respective resist patterns are removed. Subsequently, as shown in FIG. 11D, the protective oxide films 21 on the respective active regions are removed by wet etching (first wet etching) using a solution containing hydrofluoric acid. FIG. 11D shows a state in which channel regions 52, 53 are formed in the high speed MOSFET active region and the input/output MOSFET active region, respectively, in addition to the channel region 51 in the low leakage MOSFET active region.

Next, the silicon substrate 20 including the input/output MOSFET active region, the low leakage MOSFET active region, and the high speed MOSFET active region is subjected to thermal treatment (first gate oxidation) in an oxidation atmosphere. This thermal treatment forms, as shown in FIG. 12A, a first gate oxide films 22 having a thickness of approximately 6.5 nm is formed on each of the input/output MOSFET active region, the low leakage MOFSET active region, and the high speed MOSFET active region.

Subsequently, as shown in FIG. 12B, after forming a resist pattern 23 that covers the input/output MOSFET active region and the high speed MOSFET active region, the first gate oxide film 22 on the low leakage MOSFET active region is removed by wet etching (second wet etching) using a solution containing hydrofluoric acid with the use of the resist pattern 23 as a mask, thereby exposing the surface of the silicon substrate 20 in the low leakage MOSFET active region.

Thereafter, as shown in FIG. 12C, after removing the resist pattern 23, the silicon substrate 20 is subjected to thermal treatment (second gate oxidation) in an oxidation atmosphere. This thermal treatment forms a second gate oxide film 24 having a thickness of approximately 5.5 nm on the low leakage MOSFET active region. In this state, each first gate oxide film 22 on the input/output MOSFET active region and the high speed MOSFET active region has a thickness of approximately 7.5 nm.

Next, as shown in FIG. 13A, after forming a resist pattern 25 that covers the input/output MOSFET active region and the low leakage MOSFET active region, the first gate oxide firm 22 on the high speed MOSFET active region is removed by wet etching (third wet etching) using a solution containing hydrofluoric acid, thereby exposing the surface of the silicon substrate 20 in the high speed MOSFET active region.

Subsequently, as shown in FIG. 13B, after removing the resist patterns 25, the silicon substrate 20 is subjected to thermal treatment (third gate oxidation) in an oxidation atmosphere. This thermal treatment forms a third gate oxide film 26 having a thickness of approximately 2 nm on the high speed MOSFET active region. In this state, the film thickness of the first gate oxide film 22 on the input/output MOSFET active region and that of the second gate oxide film 24 on the low leakage MOSFET active region vary little.

Thereafter, gate electrodes, source/drain electrodes, an interlayer insulating, a metal wiring, and the like are formed by respective known techniques to complete the method of manufacturing a semiconductor device including MOSFETs with three kinds of gate insulating films having different thicknesses. Specifically, for example, as shown in FIG. 13C, gate electrodes 54, 57, 60 are formed on the high speed MOSFET active region, the low leakage MOSFET active region, and the input/output MOSFET active region, respectively, source/drain regions 55, 58, 61 are formed on the respective sides of the respective gate electrodes 54, 57, 60 in the respective active regions, and insulating sidewalls 56, 59, 62 are formed at the respective sides of the respective gate electrodes 54, 57, 60.

Patent Document 1: Japanese Patent Application Laid Open Publication No. 2002-343879A Patent Document 2: Japanese Patent Application Laid Open Publication No. 2003-203988A

SUMMARY OF THE INVENTION

The above described conventional technique, however, involves abnormality of transistor characteristics in the low leakage MOSFET.

In view of the foregoing, the present invention has its object of preventing abnormality of transistor characteristics in a method for manufacturing a MOS semiconductor device including three kinds of gate insulating films of which thicknesses are different from one another.

To achieve the above object, the present inventors examined factors of causing abnormality of transistor characteristics in the low leakage MOSFET manufactured by the conventional method of manufacturing a MOS semiconductor device including three kinds of gate insulating films to reach the following findings.

Namely, in the conventional MOS semiconductor device manufacturing method, as described above, the first gate oxide film is formed once on the low leakage MOSFET active region after the low leakage MOSFET active region is subjected to ion implantation for channel formation, and then, the first gate oxide film is removed for forming a second gate oxide film on the surface of the silicon substrate in the low leakage MOSFET active region which is exposed by the removal.

Boron as an impurity to be implanted in a channel region of an N-type MOSFET is liable to segregate into a silicon oxide film. Therefore, when the first gate oxide film is formed on the low leakage MOSFET active region after formation of the channel region in the low leakage MOSFET active region, boron in the vicinity of the surface of the silicon substrate in the low leakage MOSFET active region segregates into the first gate oxide film. As a result, the boron profile in the low leakage MOSFET active region after removal of the first gate oxide film on the low leakage MOSFET active region has a relatively low boron concentration in the vicinity of the surface of the silicon substrate when compared with that before formation of the first gate oxide film.

In order to set the threshold voltage of a transistor having a profile of which boron concentration is low in the surface portion of the substrate to a desired value, the dose amount in ion implantation for channel formation must be set high, which leads to increased boron concentration in the vicinity of the pn junction, inviting an increase in junction leakage, and the like.

The present invention has been made in view of the above described findings. Specifically, a first semiconductor device manufacturing method according to the present invention is a method for manufacturing a semiconductor device which includes: a first active region, a second active region, and a third active region which are formed in a semiconductor substrate and are separated from one another by element isolation regions; a first gate electrode formed on the first active region with a first gate insulating film interposed; a second gate electrode formed on the second active region with a second gate insulating film thinner than the first gate insulating film interposed; and a third gate electrode formed on the third active region with a third gate insulating film thinner than the second gate insulating film interposed, the method including: a step (a) of forming protective insulating films on the first active region, the second active region, and the third active region; a step (b) of removing the protective insulating films formed on the first active region and the third active region; a step (c) of forming, after the step (b), an insulating film to be the first gate insulating film on each of the first active region and the third active region; a step (d) of removing, after the step (c), the protective insulating film formed on the second active region; a step (e) of forming, after the step (d), an insulating film to be the second gate insulating film on the second active region; a step (f) of removing, after the step (e), the insulating film to be the first gate insulating film formed on the third active region; and a step (g) of forming, after the step (f), an insulating film to be the third gate insulating film on the third active region.

A second semiconductor device manufacturing method according to the present invention is a method for manufacturing a semiconductor device which includes: a first active region, a second active region, and a third active region which are formed in a semiconductor substrate and are separated from one another by element isolation regions; a first gate electrode formed on the first active region with a first gate insulating film interposed; a second gate electrode formed on the second active region with a second gate insulating film thinner than the first gate insulating film interposed; and a third gate electrode formed on the third active region with a third gate insulating film thinner than the second gate insulating film interposed, the method including: a step (a) of forming protective insulating films on the first active region, the second active region, and the third active region; a step (b) of removing the protective insulating film formed on the first active region; a step (c) of forming, after the step (b), an insulating film to be the first gate insulating film on the first active region; a step (d) of removing, after the step (c), the protective insulating films formed on the second active region and the third active region; a step (e) of forming, after the step (d), an insulating film to be the second gate insulating film on each of the second active region and the third active region; a step (f) of removing, after the step (e), the insulating film to be the second gate insulating film formed on the third active region; and a step (g) of forming, after the step (f), an insulating film to be the third gate insulating film on the third active region.

In the first or second semiconductor device manufacturing method, the step of removing the protective insulating film(s) on predetermined active region(s) preferably includes a step of removing, with a region other than the predetermined active region(s) covered with a resist pattern as a mask, the protective insulating film(s) on the predetermined active region(s) by wet etching.

According to the present invention, the following effects are obtained when compared with the conventional technique. Namely, since the second active region is covered with the protective insulating film when the insulating film to be the first gate insulating film, for example, a silicon oxide film is formed by thermal oxidation, oxidation of the second active region, which is caused due to the thermal oxidation, can be suppressed. This reduces segregation of the impurity implanted in the vicinity of the surface of the substrate in the second active region into the oxide film, so that the impurity concentration in the vicinity of the surface of the substrate in the second active region increases relatively when compared with the case where the insulating film to be the first gate insulating film is formed also on the second active region without covering the second active region with the protective insulating film. As a result, the dose amount in ion implantation for the channel formation to the second active region can be reduced, preventing abnormality of transistor characteristics, such as abnormality of a leakage characteristic at the pn junction.

As described above, the present invention relates to a method for manufacturing a MOS semiconductor device including three kinds of gate insulating films of which thicknesses are different from one another and can obtain an effect of preventing abnormality of transistor characteristics especially in the case applied to a method for manufacturing a semiconductor deice including a low leakage MOSFET, which is significantly useful.

BRIEF DESCRIPTION OF THE DRAWINGS

FIG. 5 is a table indicating oxide amounts of a silicon substrate in respective active regions at respective steps of the semiconductor substrate manufacturing method according to Embodiment 1 of the present invention in comparison with those according to a conventional example.

FIG. 10 is a table indicating oxide amounts of a silicon substrate in the respective active regions at respective steps of the semiconductor substrate manufacturing method according to Embodiment 4 of the present invention in comparison with those according to Embodiment 1.

DESCRIPTION OF THE PREFERRED EMBODIMENTS

Embodiment 1

Description will be given below with reference to the accompanying drawings to a semiconductor device manufacturing method according to Embodiment 1 of the present invention, specifically, a method for manufacturing a MOS semiconductor device including three kinds of gate insulating films of which thicknesses are different from one another.

FIG. 1A to FIG. 1D, FIG. 2A to FIG. 2D, FIG. 3A to FIG. 3C, and FIG. 4A to FIG. 4B are sectional views showing respective steps of the semiconductor device manufacturing method according to Embodiment 1.

Figure 1A:
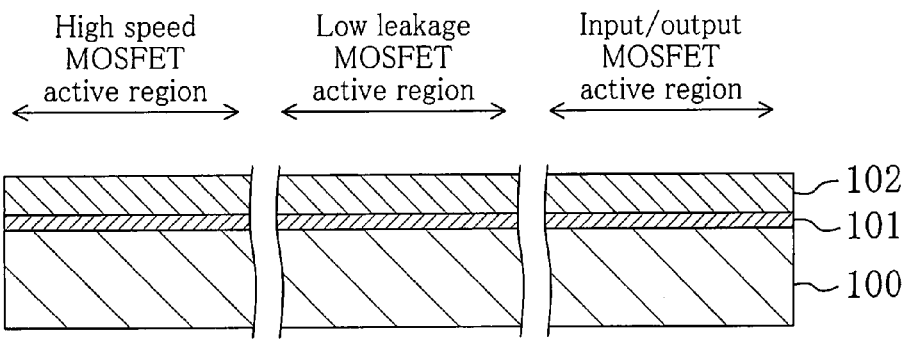
FIG. 1A to FIG. 1D are sectional views showing respective steps of a semiconductor device manufacturing method according to Embodiment 1 of the present invention.
Figure 1B:
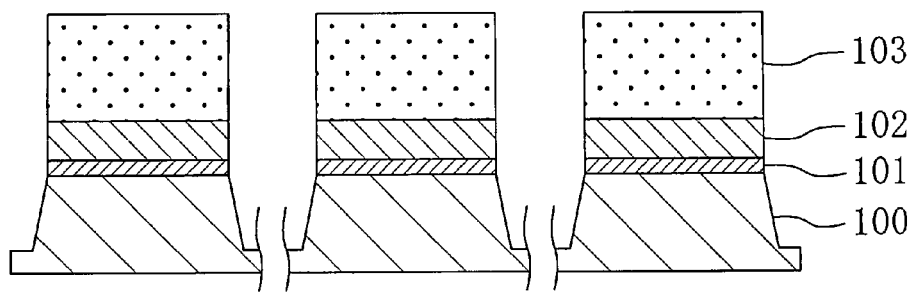

First, as shown in FIG. 1A, a pad oxide film 101 having a thickness of approximately 15 nm and a silicon nitride film 102 having a thickness of approximately 120 nm are formed sequentially on a semiconductor substrate, for example, a silicon substrate 100. Then, as shown in FIG. 1B, the silicon nitride film 102, the pad oxide film 101, and the silicon substrate 100 are subjected to dry etching using a resist pattern 103 open at parts corresponding to element isolation formation regions as a mask to form, in the silicon substrate 100, element isolation trenches (trenches) for separating an input/output MOSFET active region, a low leakage MOSFET active region, and a high speed MOSFET active region.

Figure 1C:
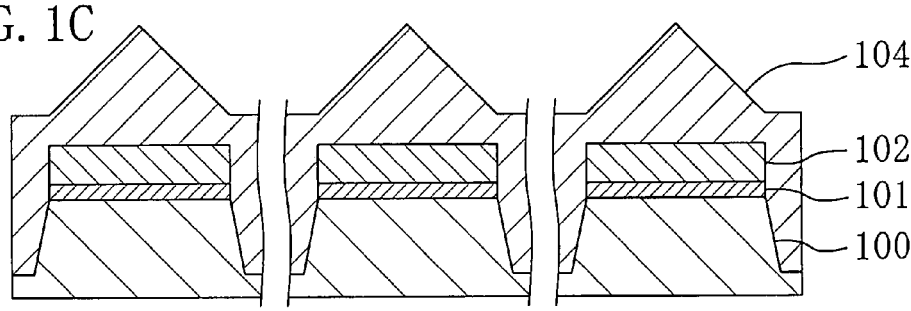
Figure 1D:
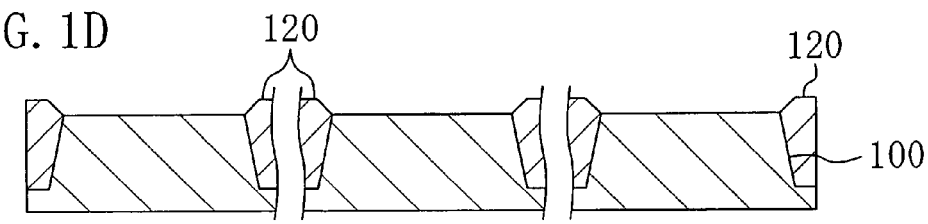

Subsequently, as shown in FIG. 1C, an insulating film, for example, a silicon oxide film 104 is deposited by, for example, CVD (chemical vapor deposition) so as to fill the element isolation trenches. Then, as shown in FIG. 1D, a part of the silicon oxide film 104 of which level is higher than that of the silicon oxide film 102 are removed by, for example, CMP (chemical mechanical polishing) or the like, and then, the silicon nitride film 102, the pad oxide film 101, and a part of the silicon oxide film 104 which remains around the element isolation trenches (except parts immediately above the element isolation trenches) are removed by, for example, wet etching or the like, thereby forming trench isolation regions 120 that separates the input/output MOSET active region, the low leakage MOSFET active region, and the high speed MOSFET active region.

Figure 2A:
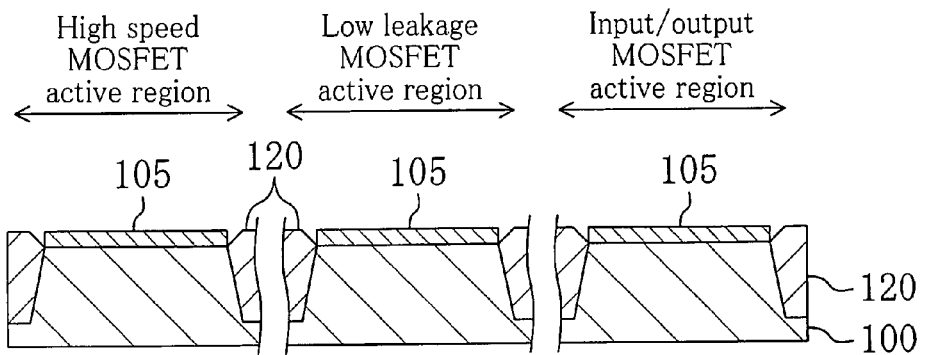
FIG. 2A to FIG. 2D are sectional views showing respective steps of the semiconductor device manufacturing method according to Embodiment 1 of the present invention.

Next, as shown in FIG. 2A, the silicon substrate 100 is subjected to thermal treatment (protective oxidation) in an oxidation atmosphere to form protective insulating films 105 formed of, for example, silicon oxide films each having a thickness of approximately 11 nm on the silicon substrate 100 in the respective active regions. Then, ion implantation for well formation is performed for forming an N well region or a P well region in each active region. Specifically, in the present embodiment, for example, boron as a P-type impurity is implanted in the high speed MOSFET active region, the low leakage MOSFET active region, and the input/output MOSFET active region at an implantation energy of 200 keV and at a dose amount of $1 \times 10^{13}$ ions/cm$^2$ to form P well regions (now shown).

Thereafter, the respective active regions are subjected to ion implantation for channel formation using resist patterns open at parts corresponding to one or two of the high speed MOSFET active region, the low leakage MOSFET active region, and the input/output MOSFET active region as masks, and the resist patterns are removed. The resist mask formation, the ion implantation, and the resist mask removal then are repeated by the number of times necessary according to the number of kinds of MOSFETs. The film thickness of the protective insulating film 105 that has been subjected to the ion implantation several times becomes thin to approximately 10 nm, for example, because of wet etching for the resist mask removal and the like.

Figure 2B:
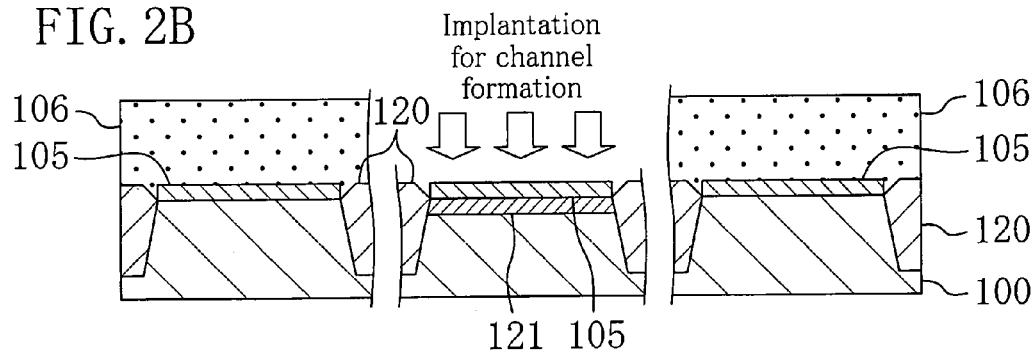

Specifically, in the present embodiment, as shown in, for example, FIG. 2B, the low leakage MOSFET active region is subjected to ion implantation for channel formation using a resist pattern 106 open at a part corresponding to the low leakage MOSFET active region, and then, the resist pattern 106 is removed. Herein, the ion implantation for channel formation to the low leakage MOSFET active region is performed, for example, using boron as a P-type impurity at an implantation energy of 10 keV and at a dose amount of $2 \times 10^{13}$ ions/cm². FIG. 2B shows a state in which a region to be a channel (hereinafter referred to as a channel region) 121 is formed in the low leakage MOSFET active region.

Figure 2C:
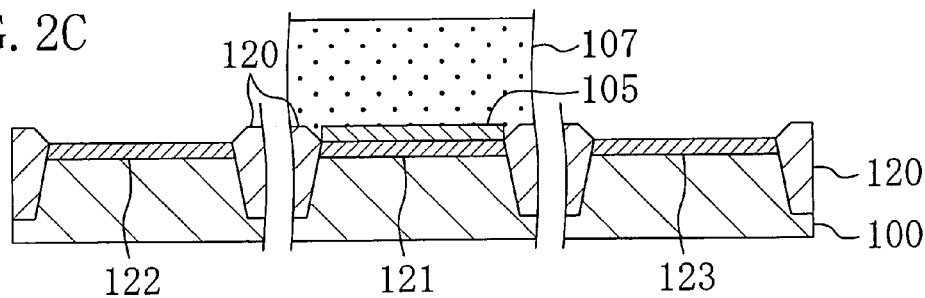

Next, similarly to the ion implantation to the low leakage MOSFET active region, ion implantation for channel formation is performed on the input/output MOSFET active region and on the high speed MOSFET active region with the use of resist patterns (not shown) that cover respective predetermined regions, and then, the resist patterns are removed. Herein, the ion implantation for channel formation to the input/output MOSFET active region is performed, for example, using boron as a P-type impurity at an implantation energy of 10 keV and at a dose amount of $5 \times 10^{12}$ ions/cm². As well, the ion implantation for channel formation to the high speed MOSFET active region is performed, for example, using boron as a P-type impurity at an implantation energy of 10 keV and at a dose amount of $1.5 \times 10^{13}$ ions/cm². Then, as shown in FIG. 2C, the protective insulating films 105 formed on the high speed MOSFET active region and the input/output MOSFET active region are removed by wet etching (first wet etching) using a solution containing, for example, hydrofluoric acid with the use of a resist pattern 107 that covers the low leakage MOSFET active region as a mask. FIG. 2C shows a state in which channel regions 112, 123 are formed on the high speed MOSFET active region and the input/output MOSFET active region, respectively, in addition to the channel region 121 on the low leakage MOSFET active region.

Figure 2D:
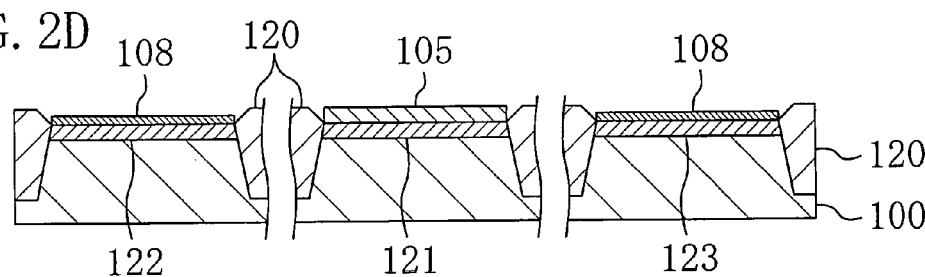

Thereafter, after removing the resist pattern 107, the silicon substrate 100 is subjected to thermal treatment (first gate oxidation) in an oxidation atmosphere, as shown in FIG. 2D. In this thermal treatment, the surface of the silicon substrate 100 is exposed in the high speed MOSFET active region and the input/output MOSFET active region, so that, for example, a silicon oxide film 108 having a thickness of approximately 6.5 nm to be a first gate insulating film is formed on each of the high speed MOSFET active region and the input/output MOSFET active region. On the other hand, in the low leakage MOSFET active region, the surface of the silicon substrate 100 is covered with the protective insulating film 105 to suppress oxidation of the silicon substrate 100 in this region significantly, thereby increasing the thickness of the protective insulating film 105 formed on the low leakage MOSFET active region only by approximately 0.8 nm.

Figure 3A:
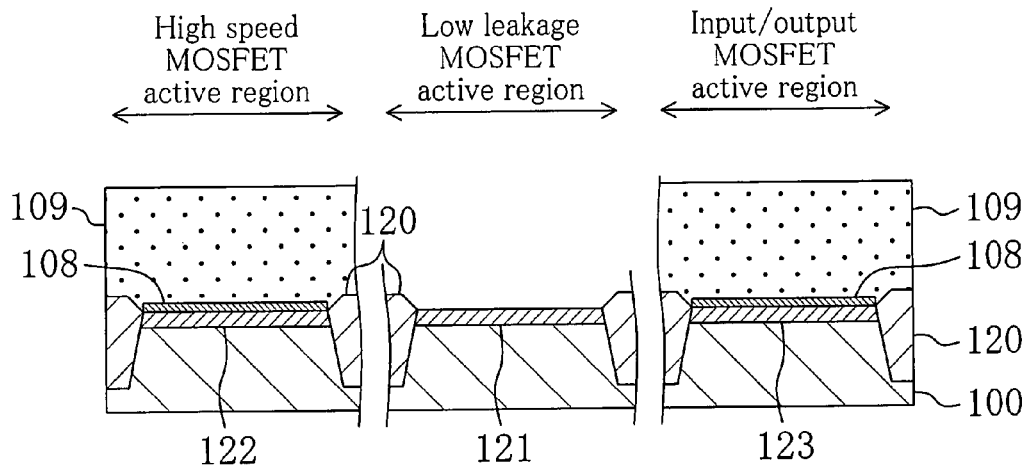
FIG. 3A to FIG. 3C are sectional views showing respective steps of the semiconductor device manufacturing method according to Embodiment 1 of the present invention.
Figure 3B:
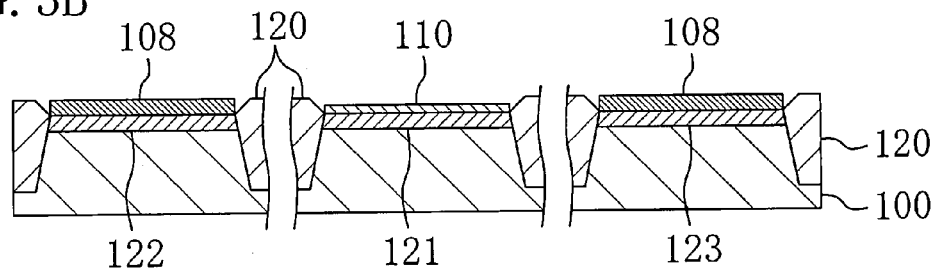
Figure 3C:
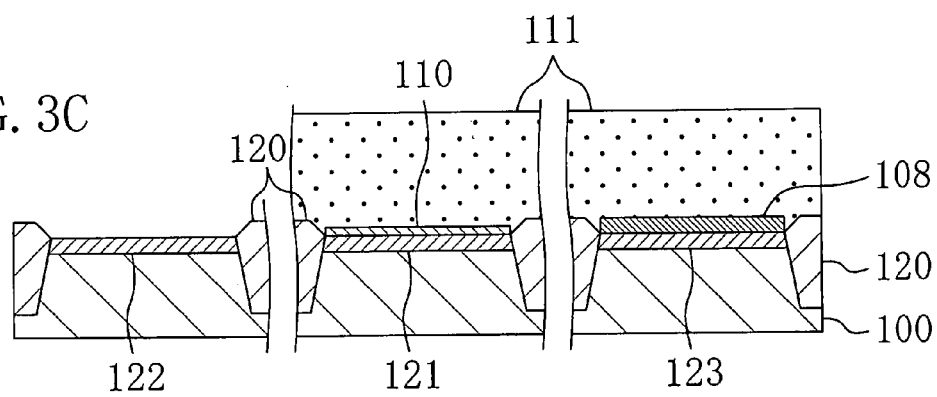
Figure 4A:
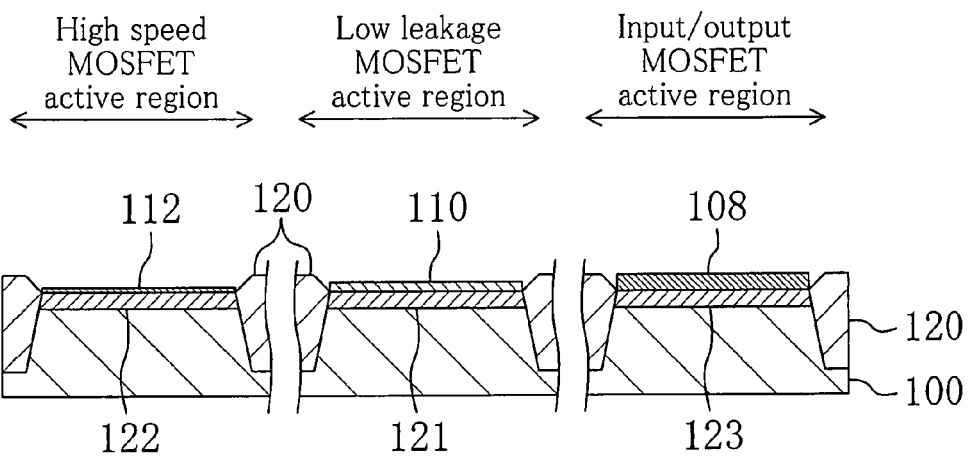
FIG. 4A to FIG. 4B are sectional views showing respective steps of the semiconductor device manufacturing method according to Embodiment 1 of the present invention.

Subsequently, as shown in FIG. 3A, the protective insulating film 105 on the low leakage MOSFET active region is removed by wet etching (second wet etching) using a solution containing, for example, hydrofluoric acid with the use of a resist pattern 109 that covers the input/output MOSFET active region and the high speed MOSFET active region as a mask. After the resist pattern 109 is removed, the silicon substrate 100 is subjected to thermal treatment (second gate oxidation) in an oxidation atmosphere, as shown in FIG. 3B, to form, for example, a silicon oxide film 110 having a thickness of approximately 5.5 nm to be a second gate insulating film on the low leakage MOSFET active region where the surface of the silicon substrate 100 is exposed. In this thermal treatment, the thickness of each silicon oxide film (the first gate insulating film) 108 formed on the high speed MOSFET active region and the input/output MOSFET active region increases to approximately 7.5 nm Next, as shown in FIG. 3C, the silicon oxide film 108 on the high speed MOSFET active region is removed by wet etching (third wet etching) using a solution containing, for example, hydrofluoric acid with the use of a resist pattern 111 that covers the low leakage MOSFET active region and the input/output MOSFET active region as a mask. After removing the resist pattern 111, the silicon substrate 100 is subjected to thermal treatment (third gate oxidation) in an oxidation atmosphere, as shown in FIG. 4A, to form, for example, a silicon oxide film 112 having a thickness of approximately 2.2 nm to be a third gate insulating film on the high speed MOSFET active region where the surface of the silicon substrate 100 is exposed. In this thermal treatment, the thickness of the silicon oxide film (the second gate insulating film) 110 formed on the low leakage MOSFET active region and the thickness of the silicon oxide film (the first insulating film) 108 formed on the input/output MOSFET active region vary little to remain approximately 5.5 nm and approximately 7.5 nm, respectively.

Figure 4B:
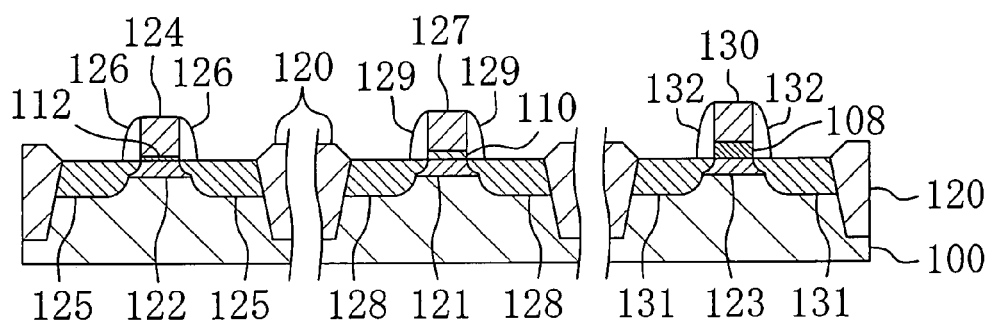

Thereafter, gate electrodes, source/drain electrodes, an interlayer insulating, a metal wiring, and the like are formed by respective known techniques to complete the method for manufacturing a semiconductor device including MOSFETs with three kinds of gate insulating films having different thicknesses. Specifically, for example, as shown in FIG. 4B, a gate electrode 124 is formed on the high speed MOSFET active region with the silicon oxide film (the third gate insulating film) 112 interposed, a gate electrode 127 is formed on the low leakage MOSFET active region with the silicon oxide film (the second gate insulating film) 110 interposed, and a gate electrode 130 is formed on the input/output MOSFET active region with the silicon oxide film (the first gate insulating film) 108 interposed. Then, source/drain regions 125, 128, and 131 are formed on the respective sides of the respective gate electrodes 124, 127, and 130 in the respective active regions, and insulating sidewalls 126, 129, 132 are formed at the respective sides of the respective gate electrodes 124, 127, 130.

FIG. 5 indicates oxide amounts of the silicon substrate in each active region at the respective steps of the semiconductor device manufacturing method according to Embodiment 1 in comparison with those according to the conventional example shown in FIG. 11A to FIG. 11D, FIG. 12A to FIG. 12C, and FIG. 13A to FIG. 13C. Wherein, the unit of the numerical values indicated in FIG. 5 is nm, and "removed" in FIG. 5 implies that the oxide film that has been formed by that time is removed." As indicated in FIG. 5, the respective total oxide amounts of the high speed MOSFET active region and the input/output MOSFET active region according to the present embodiment are approximately the same as those according to the conventional example while the total oxide amount (17.3 nm) of the low leakage MOSFET active region according to the present embodiment is smaller than the total oxide amount (23 nm) of the low leakage MOSFET active region according to the conventional example.

As described above, according to Embodiment 1, the following effects are obtained when compared with the conventional example. Namely, since the low leakage MOSFET active region is covered with the protective insulating film 105 (see FIG. 2D) when the silicon oxide film 108 to be the first gate insulating film is formed by thermal oxidation, oxidation of the low leakage MOSFET active region, which is caused due to the thermal oxidation, can be suppressed. This suppresses segregation of the impurity implanted in the vicinity of the surface of the substrate in the low leakage MOSFET active region (especially, the impurity implanted by ion implantation for channel formation shown in FIG. 2B) into the oxide film, so that the impurity concentration in the vicinity of the surface of the substrate in the low leakage MOSFET active region becomes relatively high when compared with the case where the silicon oxide film 108 is formed without covering the low leakage MOSFET active region with the protective insulating film 105. As a result, the dose amount in ion implantation for channel formation to the low leakage MOSFET active region can be reduced, preventing abnormality of transistor characteristics, such as abnormality of a leakage characteristic at the pn junction and the like.

Further, it is required not to change the characteristics of the high speed MOSFET and the characteristics of the input/output MOSFET in the case where the low leakage MOSFET is added to a multi-function chip as in the present embodiment. In Embodiment 1, the oxide amounts of the high speed MOSFET active region and the input/output MOSFET active region (see FIG. 5) are approximately the same as those in the case of manufacturing a conventional MOS semiconductor device including two kinds of gate insulating films having thicknesses different from each other as the respective gate insulating films of the high speed MOSFET and the input/output MOSET, which means satisfaction of the above requirement.

It is noted that though the pad oxide film 101 used for forming the trench isolation regions 120 is removed in Embodiment 1 (see FIG. 1D), the pad oxide film 101 may not be removed so as to be used as the protective insulating films 105 in the present embodiment.

Embodiment 2

Description will be given below with reference to the accompanying drawings to a semiconductor device manufacturing method according to Embodiment 2 of the present invention, specifically, a method for manufacturing a MOS semiconductor device including three kinds of gate insulating films of which thicknesses are different from one another.

Figure 6A:
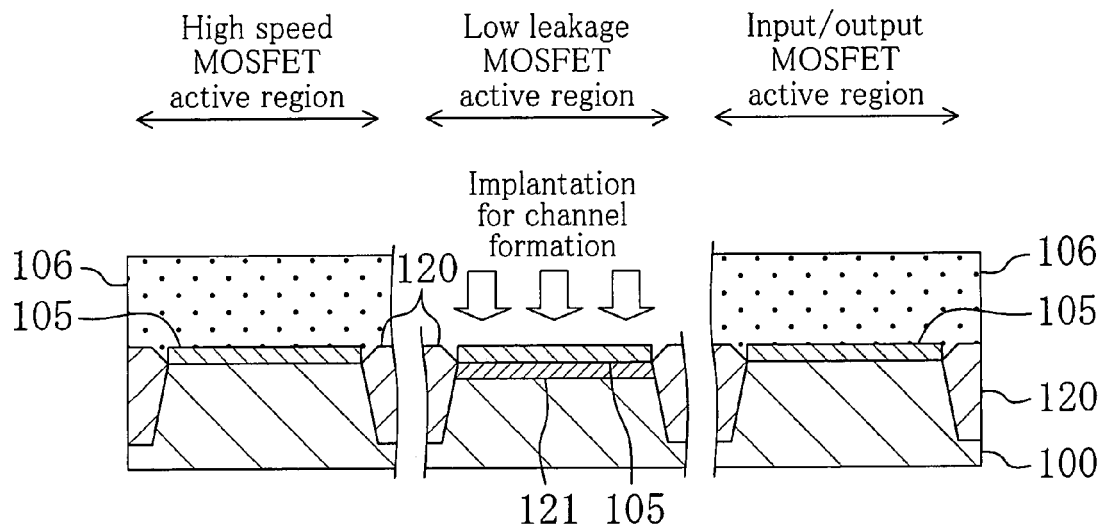
FIG. 6A to FIG. 6C are sectional views showing respective steps of a semiconductor device manufacturing method according to Embodiment 2 of the present invention.
Figure 6B:
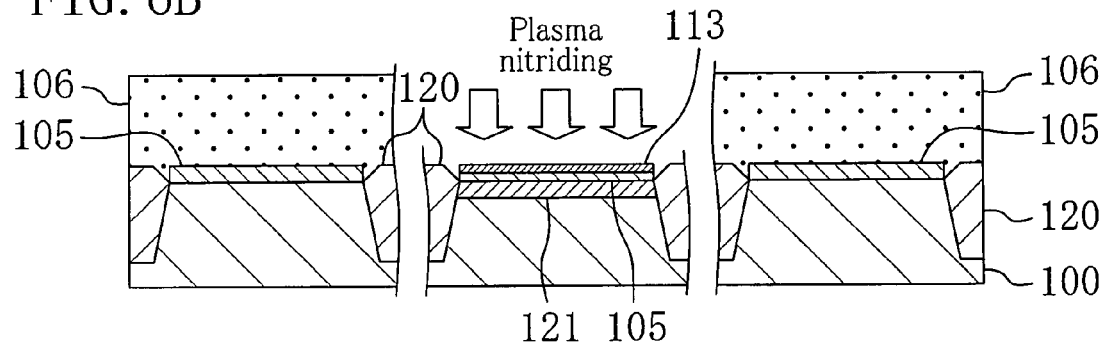
Figure 6C:
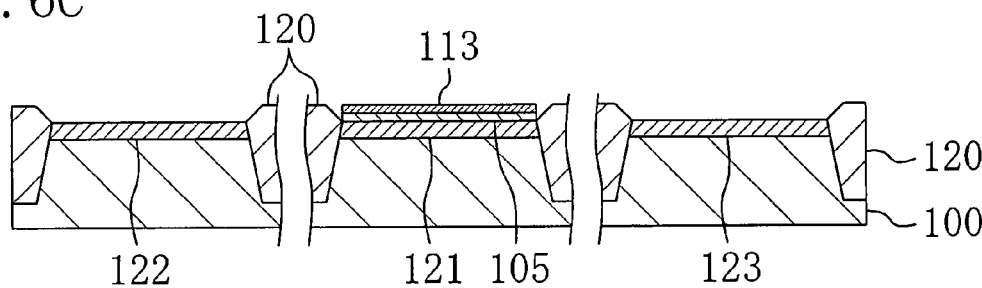

Difference of Embodiment 2 from Embodiment 1 lies in that steps shown in FIG. 6A to FIG. 6C are performed in place of the steps shown in FIG. 2B and FIG. 2C in Embodiment 1.

In detail, similarly to the steps shown in FIG. 1A to FIG. 1D and FIG. 2A in Embodiment 1, the protective insulating films 105 are formed on the input/output MOSFET active region, the low leakage MOSFET active region, and the high speed MOSFET active region first, and the P well regions (not shown) are formed in the respective active regions.

Subsequently, as shown in FIG. 6A, the low leakage MOSFET active region is subjected to ion implantation for channel formation using the resist pattern 106 open at a part corresponding to the low leakage MOSFET active region as a mask. The conditions for the ion implantation are the same as those in Embodiment 1. FIG. 6A shows a state in which the channel region 121 is formed in the low leakage MOSFET active region. Then, as shown in FIG. 6B, at least the surface portion of the protective insulating film 105 on the low leakage MOSFET active region is nitrided by, for example, plasma nitriding with the use of the remaining resist pattern 106 used in the ion implantation as a mask to form a silicon oxynitride film 113.

Next, similarly to the ion implantation to the low leakage MOSFET active region, ion implantation for channel formation is performed on the input/output MOSFET active region and on the high speed MOSFET active region with the use of the respective resist patterns (not shown) that cover the respective predetermined regions, and the respective resist patterns are removed. Herein, the respective conditions for ion implantation to the input/output MOSFET active region and to the high speed MOSFET active region are the same as those in Embodiment 1.

Thereafter, as shown in FIG. 6C, the protective insulating films 105 formed on the high speed MOSFET active region and the input/output MOSFET active region are removed by wet etching (first wet etching) using a solution containing, for example, hydrofluoric acid. In this wet etching, the etching rate to the silicon oxynitride film 113 is smaller than that to the protective insulating film (silicon oxide film that is not nitrided) 105, so that the protective oxide film 105 on the low leakage MOSFET active region is not etched or less etched in the presence of the silicon oxynitride film 113 as a mask.

Subsequently, the step shown in FIG. 2D in Embodiment 1 (the step of forming the silicon oxide film 108 to be the first gate insulating film) and the steps thereafter are performed sequentially.

According to Embodiment 2, substantially the same effects as in Embodiment 1 are expected. Further, the process can be simplified when compared with Embodiment 1 because the resist patterning steps for removing the protective insulating films 105 formed on the high speed MOSFET active region and the input/output MOSFET active region (see FIG. 2C in Embodiment 1) can be omitted.

In Embodiment 2, after ion implantation is performed on the low leakage MOSFET active region with the use of the resist pattern 106 as a mask (the step shown in FIG. 6A), the protective insulating film 105 on the low leakage MOSFET active region is nitrided with the use of the same resist pattern 106 as a mask (the step shown in FIG. 6B). In stead, the protective insulating film 105 on the low leakage MOSFET active region may be nitrided with the use of a resist pattern open at a part corresponding to the low leakage MOSFET active region as a mask, and then, ion implantation is performed on the low leakage MOSFET active region with the use of the same resist pattern as a mask.

Embodiment 3

Description will be given below with reference to the accompanying drawings to a semiconductor device manufacturing method according to Embodiment 3 of the present invention, specifically, a method for manufacturing a MOS semiconductor device including three kinds of gate insulating films of which thicknesses are different from one another.

Difference of Embodiment 3 from Embodiment 1 lies in that the step shown in FIG. 2B in Embodiment 1 (the step of ion implantation to the low leakage MOSFET active region) is performed after the step shown in FIG. 2D (the step of forming the silicon oxide film 108 to be the first gate insulating film). Wherein, steps of the ion implantation to the input/output MOSFET active region and to the high speed MOSFET active region are performed at the timings as those in Embodiment 1.

Figure 7A:
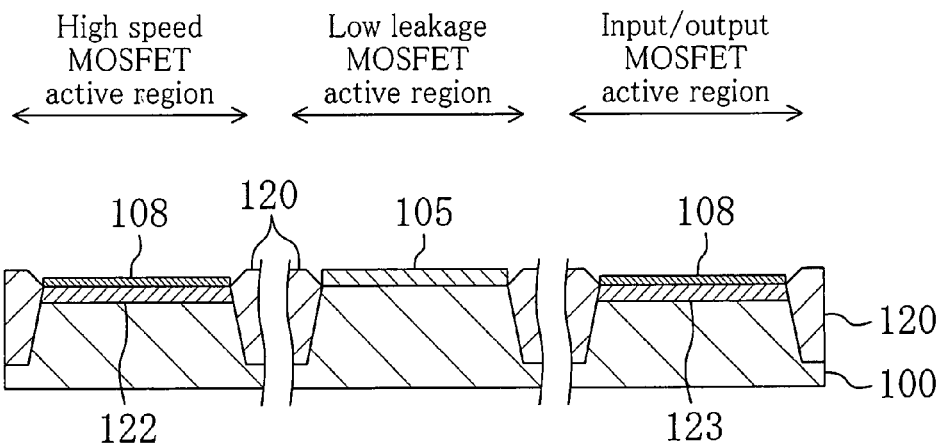
FIG. 7A to FIG. 7C are sectional views showing respective steps of a semiconductor device manufacturing method according to Embodiment 3 of the present invention.
Figure 7B:
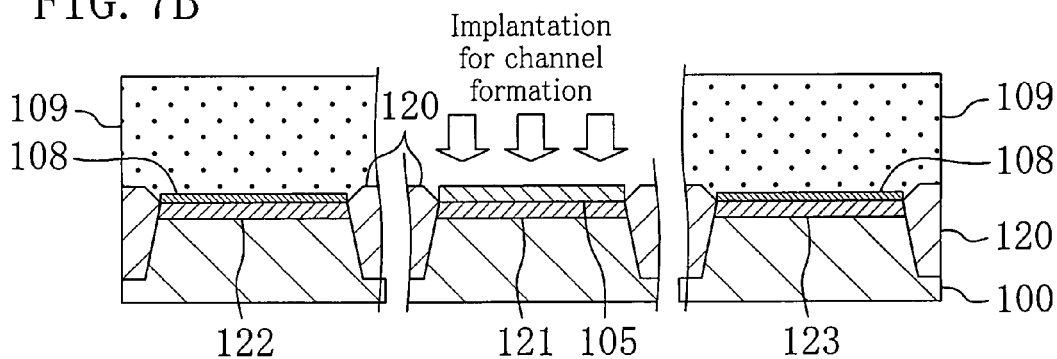
Figure 7C:
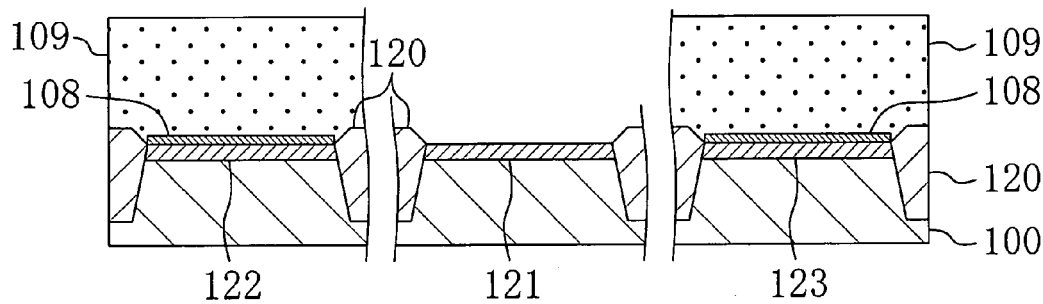

FIG. 7A to FIG. 7C are sectional views showing respective steps of the semiconductor device manufacturing method according to Embodiment 3.

In Embodiment 3, similarly to the steps shown in FIG. 1A to FIG. 1D, FIG. 2A and FIG. 2C in Embodiment 1, the protective insulating films 105 are formed on the input/output MOSFET active region, the low leakage MOSFET active region, and the high speed MOSFET active region first, and the P well regions (not shown) are formed in the respective active regions. After forming the channel regions 122, 123 in the high speed MOSFET active region and the input/output MOSFET active region, respectively, the protective insulating films 105 formed on the high speed MOSFET active region and the input/output MOSFET active region are removed. Namely, the step of forming the channel region 121 in the low leakage MOSFET active region as shown in FIG. 2B, which is performed in Embodiment 1, is not performed in the present embodiment at this timing.

Subsequently, after removing the resist pattern 107 used for selective removal of the protective insulating films 105, the silicon substrate 100 is subjected to thermal treatment (first gate oxidation) in an oxidation atmosphere with the low leakage MOSFET active region covered with the protective insulating film 105, as shown in FIG. 7A, to form the silicon oxide film 108 to be the first gate insulating film on each of the high speed MOSFET active region and the input/output MOSFET active region, similarly to the step shown in FIG. 2D in Embodiment 1. In this time point, the channel regions 122, 123 have been formed in the high speed MOSFET active region and the input/output MOSFET active region, respectively, while the channel region has not been formed yet in the low leakage MOSFET active region.

Next, as shown in FIG. 7B, the low leakage MOSFET active region is subjected to ion implantation for channel formation using the resist pattern 109 that covers the high speed MOSFET active region and the input/output MOSFET active region as a mask. Whereby, the channel region 121 is formed in the low leakage MOSFET active region. In this ion implantation, the surface of the low leakage MOSFET active region is covered with the protective insulating film 105, minimizing influence on the silicon substrate 100, such as implantation damage and contamination. The ion implantation for channel formation to the low leakage MOSFET active region is performed with the use of, for example, boron as a P-type impurity at an implantation energy of 10 keV and at a dose amount of $1.8 \times 10^{13}$ ions/cm$^2$.

Thereafter, similarly to the step shown in FIG. 3A in Embodiment 1, the protective insulating film 105 on the low leakage MOSFET active region is removed by wet etching (second wet etching) using a solution containing, for example, hydrofluoric acid with the use of the remaining resist pattern 109 used in the ion implantation to the low leakage MOSFET active region as a mask, as shown in FIG. 7C.

Subsequently, the step shown in FIG. 3B in Embodiment 1 (the step of forming the silicon oxide film 110 to be the second gate insulating film) and the steps thereafter are performed sequentially.

According to Embodiment 3, the following effects are obtained in addition to substantially the same effects as those in Embodiment 1. Namely, since the step of ion implantation for channel formation to the low leakage MOSFET active region (the step shown in FIG. 7B) is performed after the step of forming the silicon oxide film 108 to be the first gate insulating film (the step shown in FIG. 7A), no segregation of the impurity into the oxide film, which is caused due to formation of the silicon oxide film 108 (strictly, due to oxidation of the silicon substrate in the low leakage MOSFET active region accompanied by the formation of the silicon oxide film 108), is caused in the vicinity of the surface of the substrate in the low leakage MOSFET active region. In other words, the impurity implanted in the vicinity of the surface of the substrate in the low leakage MOSFET active region is segregated into the oxide film further less than that in Embodiment 1, preventing abnormality of transistor characteristics, such as abnormality of a leakage characteristic at the pn junction further reliably.

In addition, in Embodiment 3, the resist pattern 109 used in the step of ion implantation to the low leakage MOSFET active region is used also in the step of removing the protective insulating film 105 on the low leakage MOSFET active region, simplifying the process further when compared with Embodiment 1.

Embodiment 4

Description will be given below with reference to the accompanying drawings to a semiconductor device manufacturing method according to Embodiment 4 of the present invention, specifically, a method for manufacturing a MOS semiconductor device including three kinds of gate insulating films of which thicknesses are different from one another.

FIG. 8A to FIG. 8C and FIG. 9A to FIG. 9C are sectional views showing respective steps of the semiconductor manufacturing method according to Embodiment 4.

The semiconductor device manufacturing method in Embodiment 4 is different from Embodiment 1 in the step shown in FIG. 2B and the steps thereafter.

Namely, similarly to the steps shown in FIG. 1A to FIG. 1D and FIG. 2A in Embodiment 1, the protective insulating films 105 are formed on the input/output MOSFET active region, the low leakage MOSFET active region, and the high speed MOSFET active region first, and the P well regions (not shown) are formed in the respective active regions.

Figure 8A:
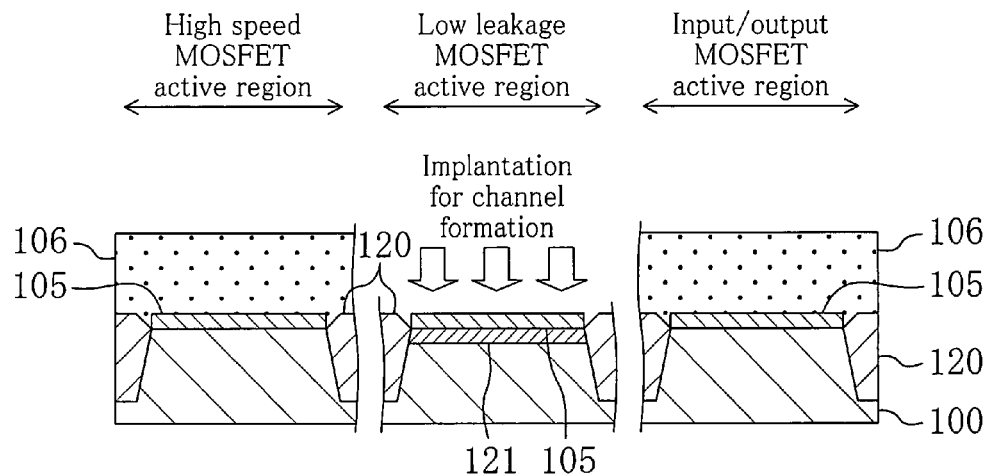
FIG. 8A to FIG. 8C are sectional views showing respective steps of a semiconductor device manufacturing method according to Embodiment 4 of the present invention.

Subsequently, similarly to the step shown in FIG. 2B in Embodiment 1, the low leakage MOSFET active region is subjected to ion implantation for channel formation using the resist pattern 106 open at a part corresponding to the low leakage MOSFET active region as a mask, as shown in FIG. 8A, and then, the resist pattern 106 is removed. The conditions for the ion implantation are the same as those in Embodiment 1. FIG. 8A shows a state in which the channel region 121 is formed in the low leakage MOSFET active region.

Figure 8B:
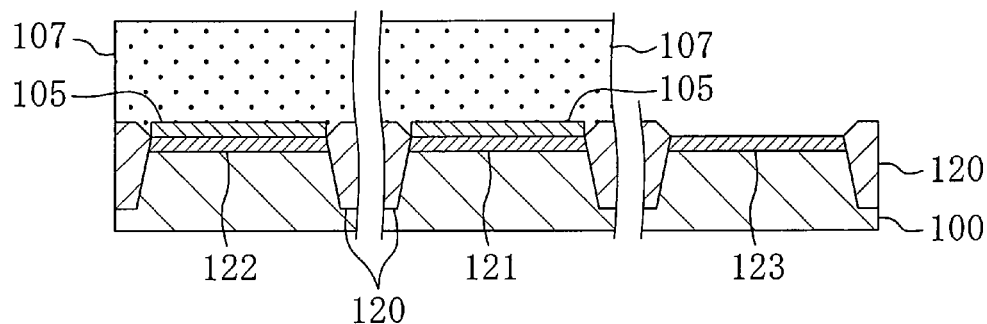

Next, similarly to the ion implantation to the low leakage MOSFET active region, ion implantation for channel formation is performed on the input/output MOSFET active region and on the high speed MOSFET active region with the use of the respective resist patterns (not shown) that cover the respective predetermined regions, and then, the resist patterns are removed. Herein, the conditions for the ion implantation to input/output MOSFET active region and to the high speed MOSFET active region are the same as those in Embodiment 1. Then, as shown in FIG. 8B, the protective insulating film 105 formed on the input/output MOSFET active region is removed by wet etching (first wet etching) using a solution containing, for example, hydrofluoric acid with the use of the resist pattern 107 open at a part corresponding to the input/output MOSFET active region.

Figure 8C:
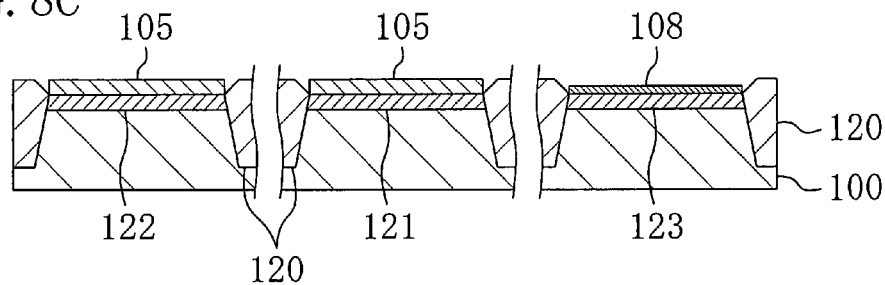

After removing the resist pattern 107, the silicon substrate 100 is subjected to thermal treatment (first gate oxidation) in an oxidation atmosphere, as shown in FIG. 8C. In this thermal treatment, the surface of the silicon substrate 100 is exposed in the input/output MOSFET active region, so that, for example, the silicon oxide film 108 having a thickness of approximately 6.5 nm to be the first gate insulating film is formed on the input/output MOSFET active region. While in the high speed MOSFET active region and the low leakage MOSFET active region, the surface of the silicon substrate 100 is covered with the protective insulating films 105 to suppress oxidation of the silicon substrate 100 in these regions significantly, so that each thickness of the protective insulating films 105 formed on the high speed MOSFET active region and the low leakage MOSFET active region increases approximately 0.8 nm at the most.

Figure 9A:
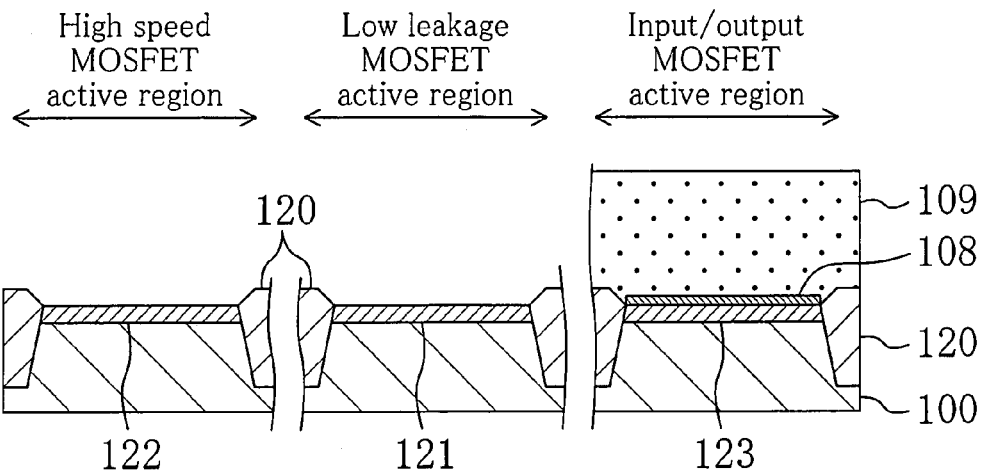
FIG. 9A to FIG. 9C are sectional views showing respective steps of the semiconductor device manufacturing method according to Embodiment 4 of the present invention.
Figure 9B:
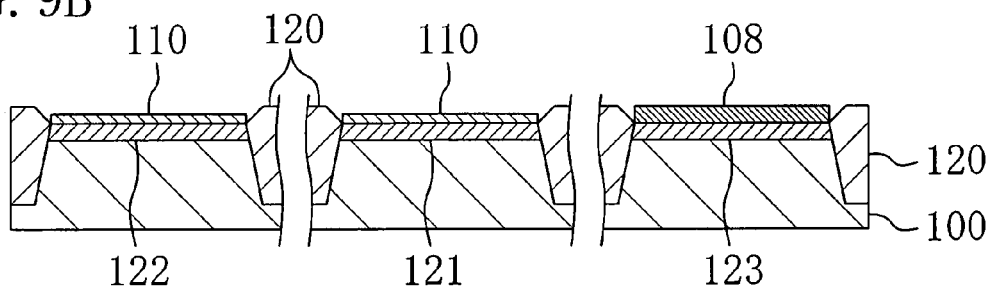

Thereafter, as shown in FIG. 9A, the protective insulating films 105 formed on the high speed MOSFET active region and the low leakage MOSFET active region are removed by wet etching (second wet etching) using a solution containing, for example, hydrofluoric acid with the use of the resist pattern 109 that covers the input/output MOSFET active region as a mask. After removing the resist pattern 109, the silicon substrate 100 is subjected to thermal treatment (second gate oxidation) in an oxidation atmosphere, as shown in FIG. 9B, to form, for example, the silicon oxide film 110 having a thickness of approximately 5.5 nm to be the second gate insulating film on each of the high speed MOSFET active region and the low leakage MOSFET active region where the surface of the silicon substrate 100 is exposed. In this thermal treatment, the thickness of the silicon oxide film (first gate insulating film) 108 formed on the input/output MOFEST active region increases to approximately 7.5 nm.

Figure 9C:
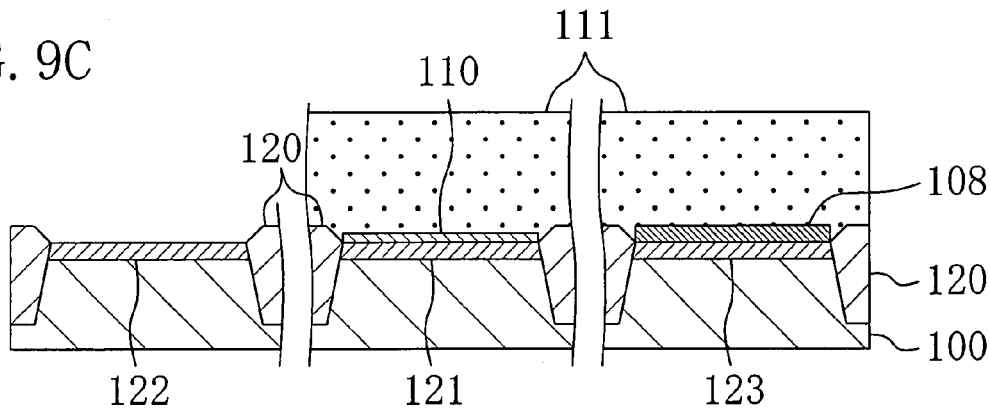
Figure 11A:
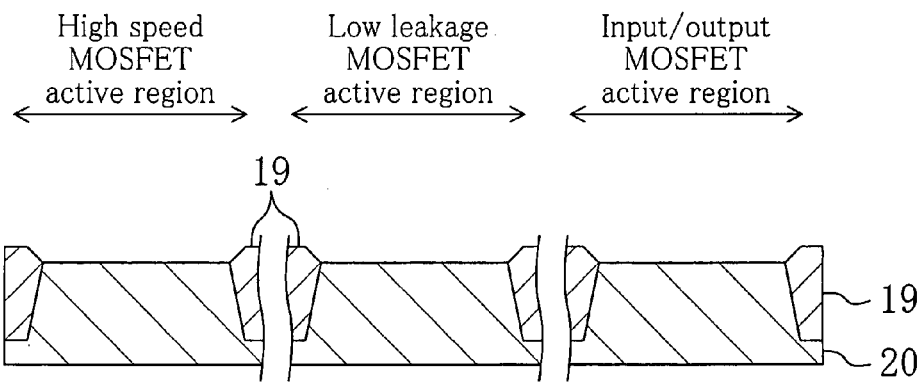
FIG. 11A to FIG. 11D are sectional views showing respective steps of a conventional semiconductor device manufacturing method.
Figure 11B:
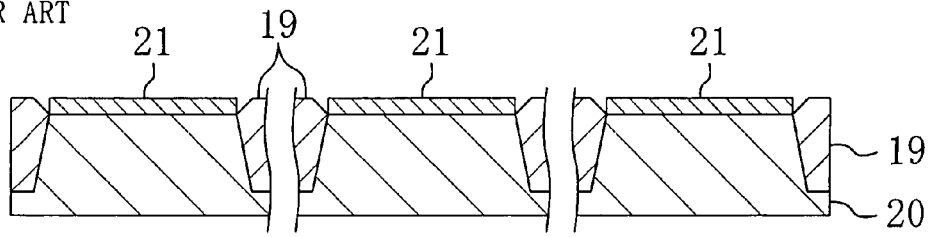
Figure 11C:
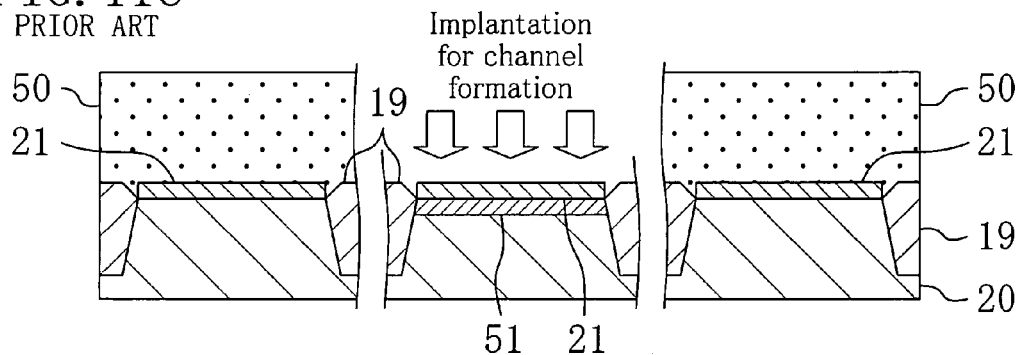
Figure 11D:
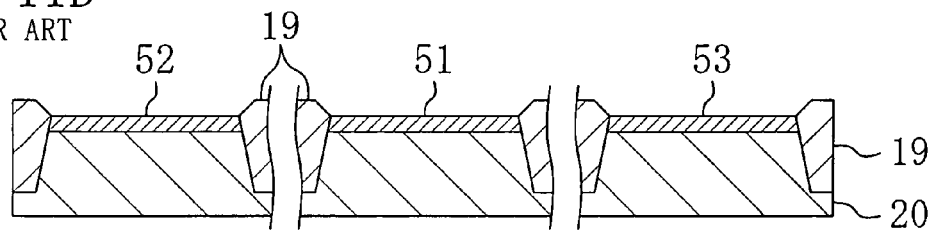
Figure 12A:
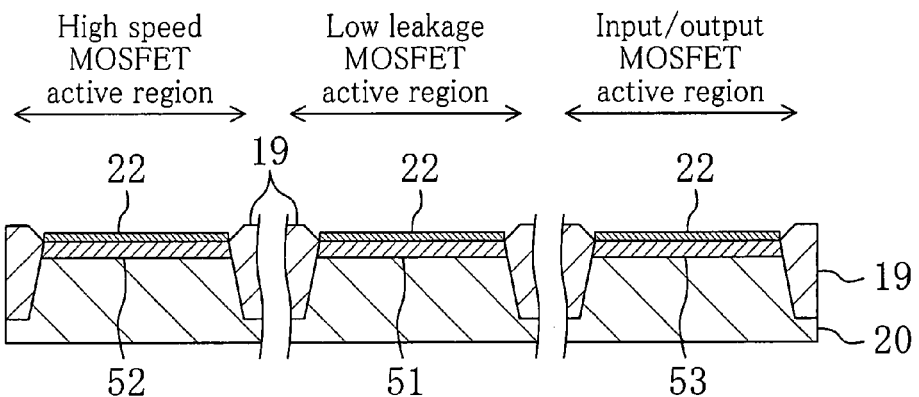
FIG. 12A to FIG. 12C are sectional views showing respective steps of the conventional semiconductor device manufacturing method.
Figure 12B:
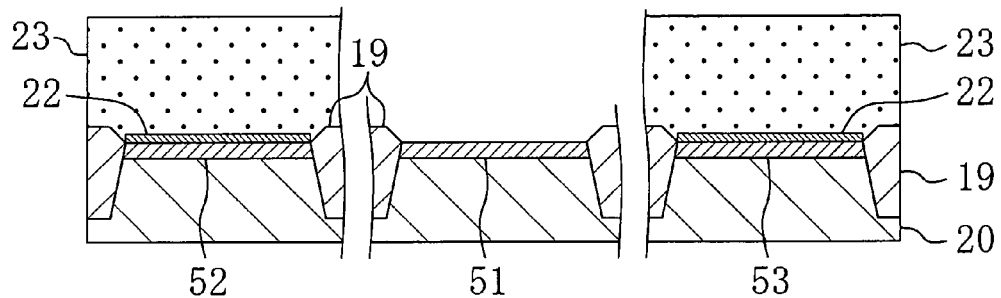
Figure 12C:
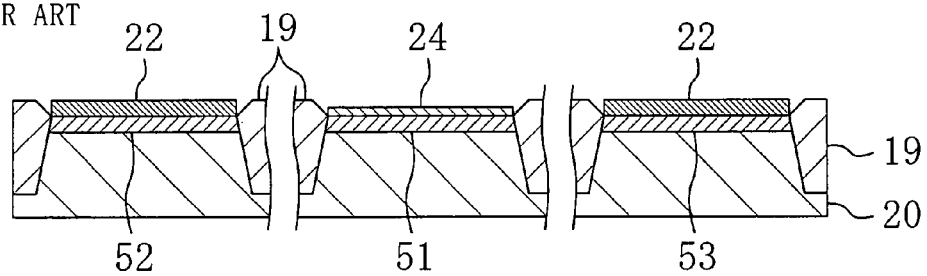
Figure 13A:
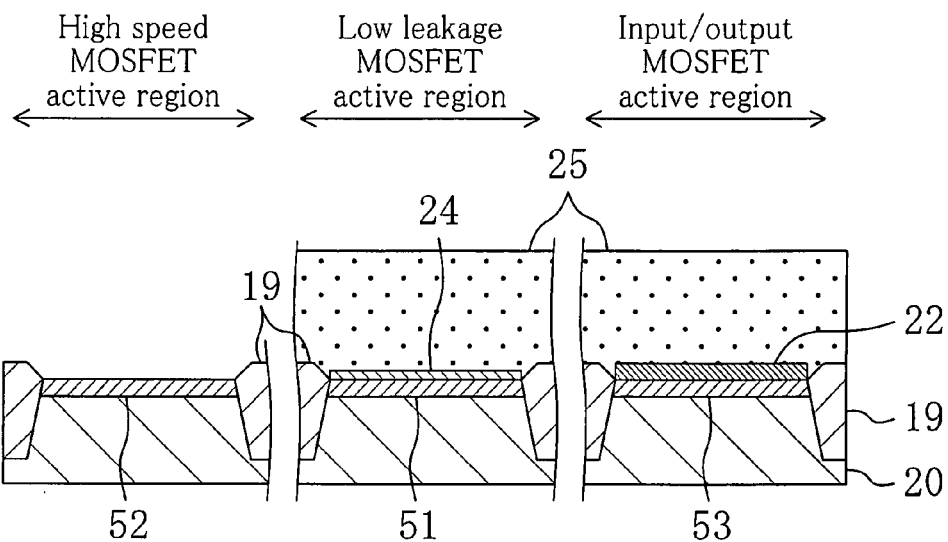
FIG. 13A to FIG. 13C are sectional views showing respective steps of the conventional semiconductor device manufacturing method.
Figure 13B:
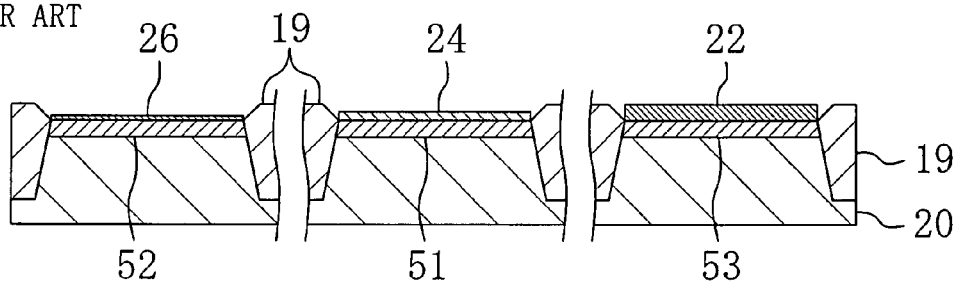
Figure 13C:
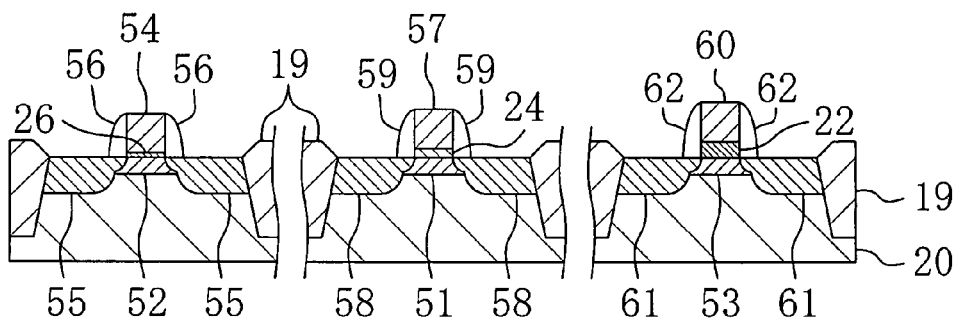

Subsequently, as shown in FIG. 9C, the silicon oxide film 110 on the high speed MOSFET active region is removed by wet etching (third wet etching) using a solution containing, for example, hydrofluoric acid with the use of the resist pattern 111 that covers the low leakage MOSFET active region and the input/output MOSFET active region as a mask.

Next, the step shown in FIG. 4A in Embodiment 1 (the step of forming the silicon oxide film 112 to be the third gate insulating film) and the steps thereafter are performed sequentially.

FIG. 10 indicates oxide amounts of the silicon substrate in each active region at the respective steps of the semiconductor device manufacturing method according to Embodiment 4 in comparison with those according to Embodiment 1. Wherein, the unit of the numerical values indicated in FIG. 10 is nm, and "removed" in FIG. 10 implies that "the oxide film that has been formed at that time is removed." As indicated in FIG. 10, the respective total oxide amounts of the low leakage MOSFET active region and the input/output MOSFET active region according to the present embodiment are approximately the same as those according to Embodiment 1 while the total oxide amount (19.5 nm) of the high speed MOSFET active region according to the present embodiment is smaller than the total oxide amount (20.7 nm) of the high speed MOSFET active region according to Embodiment 1.

As described above, according to Embodiment 4, the following effects are obtained when compared with the conventional example. Namely, since the low leakage MOSFET active region is covered with the protective insulating film 105 (see FIG. 8C) when the silicon oxide film 108 to be the first gate insulating film is formed by thermal oxidation, oxidation of the low leakage MOSFET active region, which caused is due to the thermal oxidation, can be suppressed. This suppresses segregation of the impurity implanted in the vicinity of the surface of the substrate in the low leakage MOSFET active region (especially the impurity implanted by ion implantation for channel formation shown in FIG. 8A) into the oxide film, so that the impurity concentration in the vicinity of the surface of the substrate in the low leakage MOSFET active region becomes relatively high when compared with the case where the silicon oxide film 108 is formed without covering the low leakage MOSFET active region with the protective insulating film 105, that is, the conventional example. Hence, the dose amount in ion implantation for channel formation to the low leakage MOSFET active region can be reduced, preventing abnormality of transistor characteristics, such as abnormality of a leakage characteristic at the pn junction and the like.

According to Embodiment 4, the oxide amount of the high speed MOSFET active region can be reduced further than that in Embodiment 1, improving the transistor characteristics, such as a leakage characteristic and the like further effectively.

Furthermore, it is required not to change the characteristics of the high speed MOSFET and the characteristics of the input/output MOSFET in the case where the low leakage MOSFET is added to a multi-function chip as in the present embodiment. In Embodiment 4, the oxide amount of the input/output MOSFET active region (see FIG. 10) is approximately the same as that in the case of manufacturing a conventional MOS semiconductor device including two kinds of gate insulating films having thicknesses different from each other as the respective gate insulating films of the high speed MOSFET and the input/output MOSET, which means satisfaction of the above requirement as to the input/output MOSFET active region. Referring to the high speed MOSFET active region, the difference between the oxide amount thereof according to Embodiment 4 (see FIG. 10) and the oxide amount of the high speed MOSFET active region in the case of manufacturing the conventional MOS semiconductor device including two kinds of gate insulating films having thicknesses different from each other is small, approximately 1.2 nm, which changes little the transistor characteristics, such as a narrow channel characteristic and the like.

In Embodiment 4, after the steps (see FIG. 8A and the like) of ion implantation to the low leakage MOSFET active region and to the high speed MOSFET active region, at least the surface portions of the protective insulating films 105 formed on the low leakage MOSFET active region and the high speed MOSFET active region may be nitrided by plasma nitriding with the use of the respective remaining resist patterns used in the respective steps of ion implantation as masks, and then, the protective insulating film 105 formed on the input/output MOSFET active region is removed by wet etching (first wet etching) using a solution containing, for example, hydrofluoric acid with the use of the nitrided regions as a mask. In this case, the sequence may be changed between the steps of ion implantation to the low leakage MOSFET active region and to the high speed MOSFET active region and the nitriding steps in the respective active regions, wherein the same resist pattern is used in the respective steps. This eliminates the need of the resist patterning step (see FIG. 8B) for removing the protective insulating film 105 formed on the input/output MOSFET active region, thereby simplifying the process.

It is noted that though Embodiments 1 to 4 exemplify a MOS semiconductor device including a high speed MOSFET active region, a low leakage MOSFET active region, and an input/output MOSFET active region as a MOS semiconductor device including three kinds of gate insulating films of which thicknesses are different from one another, the present invention is not limited thereto, of course.

What is claimed is:

1. A method for manufacturing a semiconductor device which includes: a first active region, a second active region, and a third active region which are formed in a semiconductor substrate and are separated from one another by element isolation regions; a first gate electrode formed on the first active region with a first gate insulating film interposed; a second gate electrode formed on the second active region with a second gate insulating film thinner than the first gate insulating film interposed; and a third gate electrode formed on the third active region with a third gate insulating film thinner than the second gate insulating film interposed, the method comprising:

a step (a) of forming protective insulating films on the first active region, the second active region, and the third active region;

a step (b) of removing the protective insulating films formed on the first active region and the third active region;

a step (c) of forming, after the step (b), an insulating film to be the first gate insulating film on each of the first active region and the third active region;

a step (d) of removing, after the step (c), the protective insulating film formed on the second active region;

a step (e) of forming, after the step (d), an insulating film to be the second gate insulating film on the second active region;

a step (f) of removing, after the step (e), the insulating film to be the first gate insulating film formed on the third active region; and a step (g) of forming, after the step (f), an insulating film to be the third gate insulating film on the third active region.

2. The semiconductor device manufacturing method of claim 1, wherein the element isolation regions are trench isolation regions.

3. The semiconductor device manufacturing method of claim 1, wherein the step (b) includes a step of removing the protective insulating films formed on the first active region and the third active region by wet etching using a resist pattern that covers the second active region as a mask.

4. The semiconductor device manufacturing method of claim 1, wherein the step (d) includes a step of removing the protective insulating film formed on the second active region by wet etching using a resist pattern that covers the first active region and the third active region as a mask.

5. The semiconductor device manufacturing method of claim 1, wherein the step (f) includes a step of removing the insulating film to be the first gate insulating film formed on the third active region by wet etching using a resist pattern that covers the first active region and the second active region as a mask.

6. The semiconductor device manufacturing method of claim 1, further comprising:

a step (h) of subjecting, between the step (a) and the step (b), the second active region to ion implantation for channel formation.

7. The semiconductor device manufacturing method of claim 1, further comprising:

a step (h) of subjecting, between the step (c) and the step (d), the second active region to ion implantation for channel formation.

8. The semiconductor device manufacturing method of claim 7, wherein the step (h) includes a step of subjecting the second active region to ion implantation for channel formation using a resist pattern that covers the first active region and the third active region as a mask, and the step (d) includes a step of removing the protective insulating film formed on the second active region by wet etching using the resist pattern used in the step (h) as a mask.

9. The semiconductor device manufacturing method of claim 1, further comprising:

a step (i) of nitriding, between the step (a) and the step (b), at least a surface portion of the protective insulating film formed on the second active region.

10. The semiconductor device manufacturing method of claim 9, wherein the step (b) includes a step of removing the protective insulating films formed on the first active region and the third active region by wet etching using a part nitrided in the step (i) as a mask.

11. The semiconductor device manufacturing method of claim 9, further comprising:

a step (h) of subjecting, between the step (a) and the step (i), the second active region to ion implantation for channel formation using a resist pattern that covers the first active region and the third active region as a mask, wherein the step (i) includes a step of nitriding at least the surface portion of the protective insulating film formed on the second active region with the use of the resist pattern used in the step (h) as a mask.

12. The semiconductor device manufacturing method of claim 9, wherein the step (i) includes a step of nitriding at least the surface portion of the protective insulating film formed on the second active region using a resist pattern that covers the first active region and the third active region as a mask, and the method further comprising a step (h) of subjecting, between the step (i) and the step (b), the second active region to ion implantation for channel formation using the resist pattern used in the step (i) as a mask.

* * * * *